US011526022B2

(12) United States Patent
Minamisawa

(10) Patent No.: US 11,526,022 B2
(45) Date of Patent: *Dec. 13, 2022

(54) OPTICAL UNIT HAVING SHAKE CORRECTION FUNCTION, WIRING MEMBER, AND METHOD OF PRODUCING WIRING MEMBER

(71) Applicant: NIDEC SANKYO CORPORATION, Nagano (JP)

(72) Inventor: Shinji Minamisawa, Nagano (JP)

(73) Assignee: NIDEC SANKYO CORPORATION, Nagano (JP)

(*) Notice: Subject to any disclaimer, the term of this patent is extended or adjusted under 35 U.S.C. 154(b) by 339 days.

This patent is subject to a terminal disclaimer.

(21) Appl. No.: 16/830,234

(22) Filed: Mar. 25, 2020

(65) Prior Publication Data

US 2020/0310150 A1    Oct. 1, 2020

(30) Foreign Application Priority Data

Mar. 28, 2019    (JP) .............................. JP2019-063545

(51) Int. Cl.
*G02B 27/64* (2006.01)
*H02K 11/215* (2016.01)
(Continued)

(52) U.S. Cl.
CPC ............. *G02B 27/646* (2013.01); *G03B 5/06* (2013.01); *H02K 11/215* (2016.01); *H05K 1/18* (2013.01); *G03B 2205/0023* (2013.01)

(58) Field of Classification Search
CPC .................... G02B 27/646; G03B 5/06; G03B 2205/0023; G03B 5/00; H02K 11/215
See application file for complete search history.

(56) References Cited

U.S. PATENT DOCUMENTS 7,856,177 B2    12/2010  Ishikawa et al.
2010/0259822 A1  10/2010  Huang et al.
(Continued)

FOREIGN PATENT DOCUMENTS

CN    101138236    3/2008
CN    101393377    3/2009
(Continued)

OTHER PUBLICATIONS

Machine translation of WO 2018/151388 retrieved electronically from Espacenet Apr. 13, 2022 (Year: 2022).*

(Continued)

*Primary Examiner* — Cara E Rakowski
(74) *Attorney, Agent, or Firm* — JCIPRNET

(57) ABSTRACT

An optical unit having a shake correction function, includes a movable body including an optical module, a fixed body supporting the movable body in a swingable manner, a swing drive mechanism swinging the movable body relative to the fixed body and including a magnet and a coil, one of the magnet and the coil being fixed to the movable body, the other one of the magnet and the coil being fixed to the fixed body, a magnetic member returning the movable body to an original position, a magnetic detection sensor detecting a magnetic field of the magnet, and a wiring member being connected with the coil. The wiring member includes a mounting face on which the magnetic detection sensor, the magnetic member, and the coil are fixed. The centers of the magnetic detection sensor, the magnetic member, and the coil are coaxially fixed to the mounting face.

7 Claims, 7 Drawing Sheets

(51) Int. Cl.
    *G03B 5/06*        (2021.01)
    *H05K 1/18*        (2006.01)

(56)           References Cited

U.S. PATENT DOCUMENTS

| | | |
|---|---|---|
| 2016/0134813 A1 | 5/2016 | Hu et al. |
| 2018/0059432 A1 | 3/2018 | Gong |
| 2020/0073203 A1* | 3/2020 | Arai .......................... G03B 5/06 |
| 2020/0174272 A1* | 6/2020 | Minamisawa ........... G03B 5/04 |
| 2020/0174275 A1* | 6/2020 | Minamisawa ........... G02B 7/08 |
| 2020/0310153 A1* | 10/2020 | Sue ...................... G02B 27/646 |

FOREIGN PATENT DOCUMENTS

| | | | |
|---|---|---|---|
| CN | 102480588 | 5/2012 | |
| CN | 104583830 | 4/2015 | |
| JP | 2009086494 | 4/2009 | |
| JP | 2015069004 | 4/2015 | |
| JP | 2018189816 | 11/2018 | |
| KR | 20150009697 | 1/2015 | |
| WO | WO-2018151388 A1 * | 8/2018 | ............. G02B 13/00 |

OTHER PUBLICATIONS

Office Action of China Counterpart Application, with English translation thereof, dated May 31, 2021, pp. 1-16.

\* cited by examiner

OPTICAL UNIT HAVING SHAKE CORRECTION FUNCTION, WIRING MEMBER, AND METHOD OF PRODUCING WIRING MEMBER

CROSS REFERENCE TO RELATED APPLICATION

The present application claims priority under 35 U.S.C. § 119 to Japanese Application No. 2019-063545 filed on Mar. 28, 2019, and the entire content of which is incorporated herein by reference.

BACKGROUND

Field of the Disclosure

At least an embodiment of the present disclosure relates to an optical unit having a shake correction function installed on such as a mobile phone equipped with a camera, a wiring member, and a method of producing the wiring member.

Description of the Related Documents

An example of such an optical unit is an optical unit having a shake correction function disclosed in Japanese Unexamined Patent Publication No. 2018-189816 (JP 2018-189816 A). The optical unit having a shake correction function includes a movable body 3, a fixed body 5, magnets 26 fixed to the fixed body 5, and coils 62 and magnet members 67 fixed to walls 56 of the movable body 3. JP 2018-189816 A discloses an attitude return mechanism 7 that returns the movable body 3 to the original position with the magnetic attractive force of the magnets 26 and the magnetic members 67, and a swinging magnetic drive mechanism 6 that applies a driving force by the magnetic attractive force by the magnets 26 and the coils 62 being energized. Furthermore, J P 2018-189816 A discloses a configuration in which Hall elements 64 (hereinafter also referred to as "magnetic detection sensors") are disposed between the magnets 26 and the magnetic members 67.

An optical unit having a shake correction function according to JP 2018-189816 A has a structure in which a coil 62 and a magnetic member 67 is fixed to a wall 56 of a movable body 3, and a Hall element 64 is disposed between the magnet 26 and the magnetic member 67. The Hall element 64, the coil 62, and the magnetic member 67 need to be assembled while their functional centers are aligned. However, with the conventional structure, such assembly is difficult, and the components may have variation in tolerance and assembly error. This may cause insufficient alignment. Insufficient alignment causes a decrease in the drive torque and the position detection accuracy. This may cause unstable shake correction performance.

An object of at least an embodiment of the present disclosure is to facilitate alignment of the magnetic detection sensor, the coil, and the magnetic member.

SUMMARY

An optical unit having a shake correction function that solves the above-described issues includes a movable body including an optical module, a fixed body that supports the movable body in a swingable manner, a swing drive mechanism in which one of a magnet and a coil is fixed to the movable body and the other of the magnet and the coil is fixed to the fixed body to swing the movable body relative to the fixed body, a magnetic member that returns the movable body to an original position, a magnetic detection sensor that detects a magnetic field of the magnet, and a wiring member connected with the coil, the wiring member including a mounting face on which the magnetic detection sensor, the magnetic member, and the coil are fixed, the center of the magnetic detection sensor, the center of the magnetic member, and the center of the coil being coaxially aligned and fixed to the mounting face.

At least an embodiment of the present disclosure relates to a wiring member. The wiring member includes at least two mounting faces on each of which a magnetic detection sensor, a magnetic member, and a coil are fixed. The center of the magnetic detection sensor, the center of the magnetic member, and the center of the coil are coaxially aligned and fixed to each of the mounting faces.

A method of producing a wiring member having at least two mounting faces on each of which a magnetic detection sensor, a magnetic member, and a coils are fixed, the method includes fixing the magnetic detection sensor to a sensor fixing region of each of the mounting faces, and positioning and fixing the magnetic member and the coil on each of the mounting faces such that the center of the magnetic detection sensor, the center of the magnetic member, and the center of the coil are coaxially aligned.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 5:
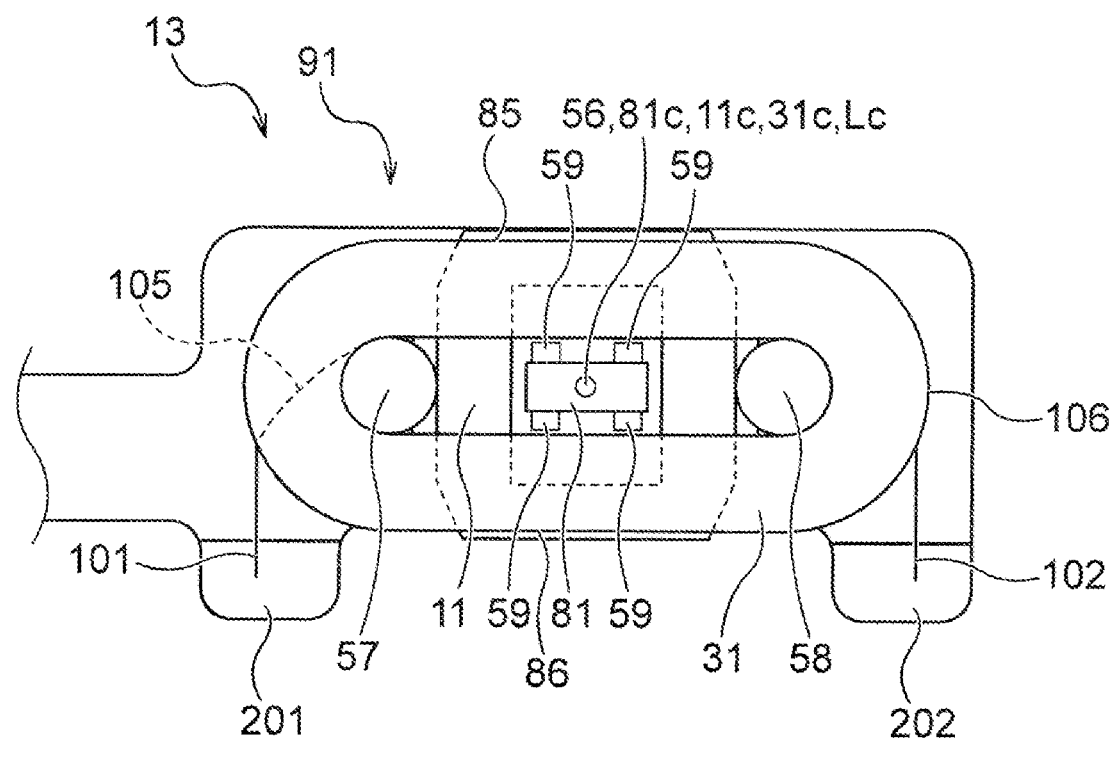
FIG. 5 is a front view of the main portion of the wiring member as viewed from the coil side and corresponding to FIG. 4.
Figure 5:
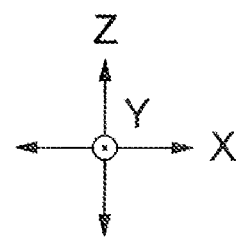
Figure 6:
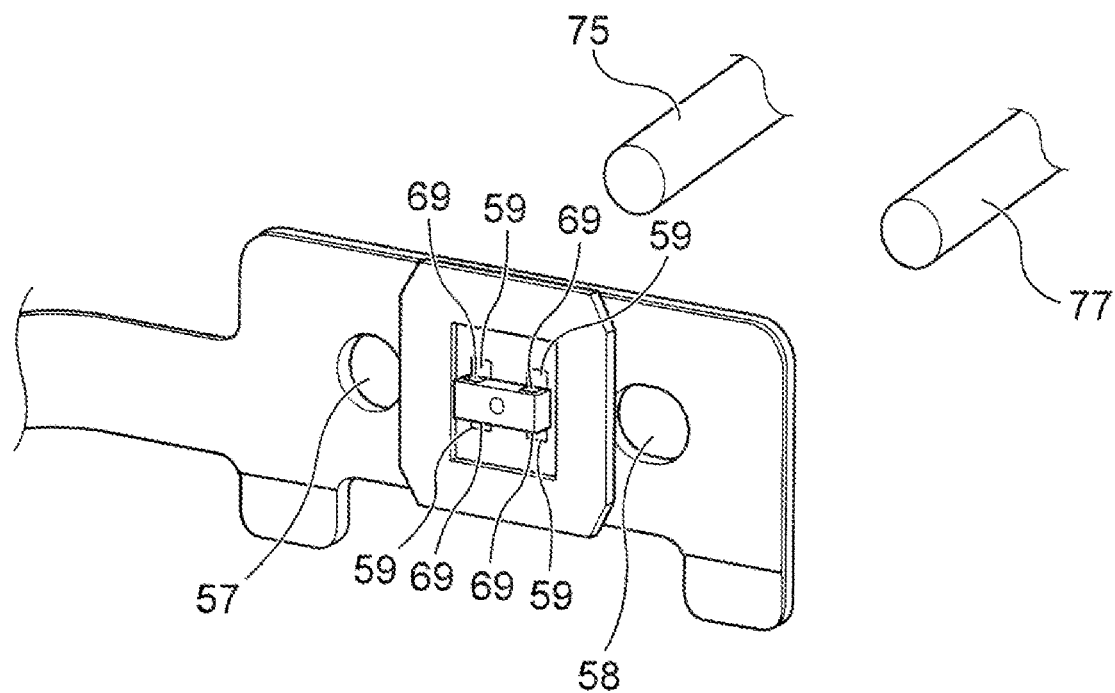
FIG. 6 is a perspective view of a state in which the coil is removed and corresponding to FIG. 4.
Figure 6:
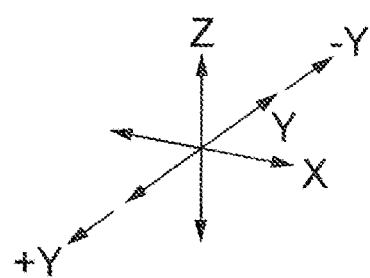
Figure 7:
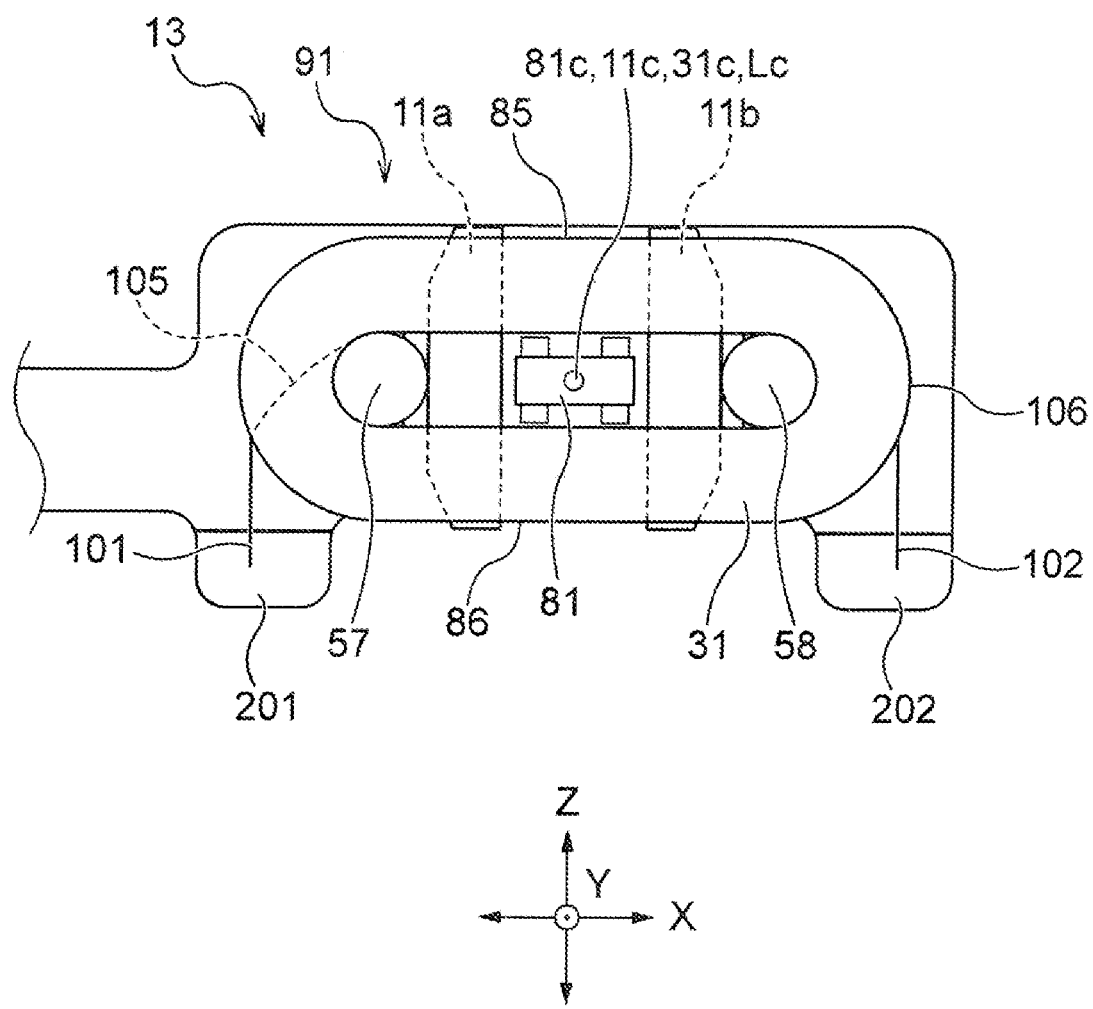
FIG. 7 is a front view corresponding to FIG. 5 and illustrating a second embodiment of the present disclosure.

An optical unit having a shake correction function according to the present disclosure will be described in detail with reference to FIGS. 1 to 6 illustrating a first embodiment and FIG. 7 illustrating a second embodiment.

First Embodiment

An optical unit 1 having a shake correction function according to a first embodiment of the present disclosure is an optical unit having a function of shake correcting at least pitching (vertical shape) and yawing (lateral shake) of an optical module 3. The optical module 3 is used, for example, as a thin camera or the like mounted on a mobile phone equipped with a camera or a tablet personal computer (PC).

An actuator portion is a main component of the optical unit 1 having a shake correction function and holds the optical module 3 and corrects shake of the optical module 3 in the pitching direction Y and the yawing direction X.

The optical unit 1 having a shake correction function according to the first embodiment includes a movable body 5, a fixed body 7, a swing drive mechanism 23, magnetic members 11 and 12, magnetic detection sensors 81 and 82, magnetic members 11 and 12, and a wiring member 13. The movable body 5 includes an optical module 3. The fixed body 7 supports the movable body 5 so as to be swingable. The swing drive mechanism 23 includes magnets 33 and 34 fixed to the movable body 5 and coils 31 and 32 fixed to the fixed body 7, and swings the movable body 5 relative to the fixed body 7. The magnetic members 11 and 12 return the movable body 5 to the original position. The magnetic detection sensors 81 and 82 detect the magnetic fields of the magnets 33 and 34, by the magnetic attractive forces of the magnets 33 and 34. The wiring member 13 is connected with the coils 31 and 32.

The magnetic detection sensors 81 and 82 are composed of Hall elements. The wiring member 13 includes a flexible wiring board.

Figure 2:
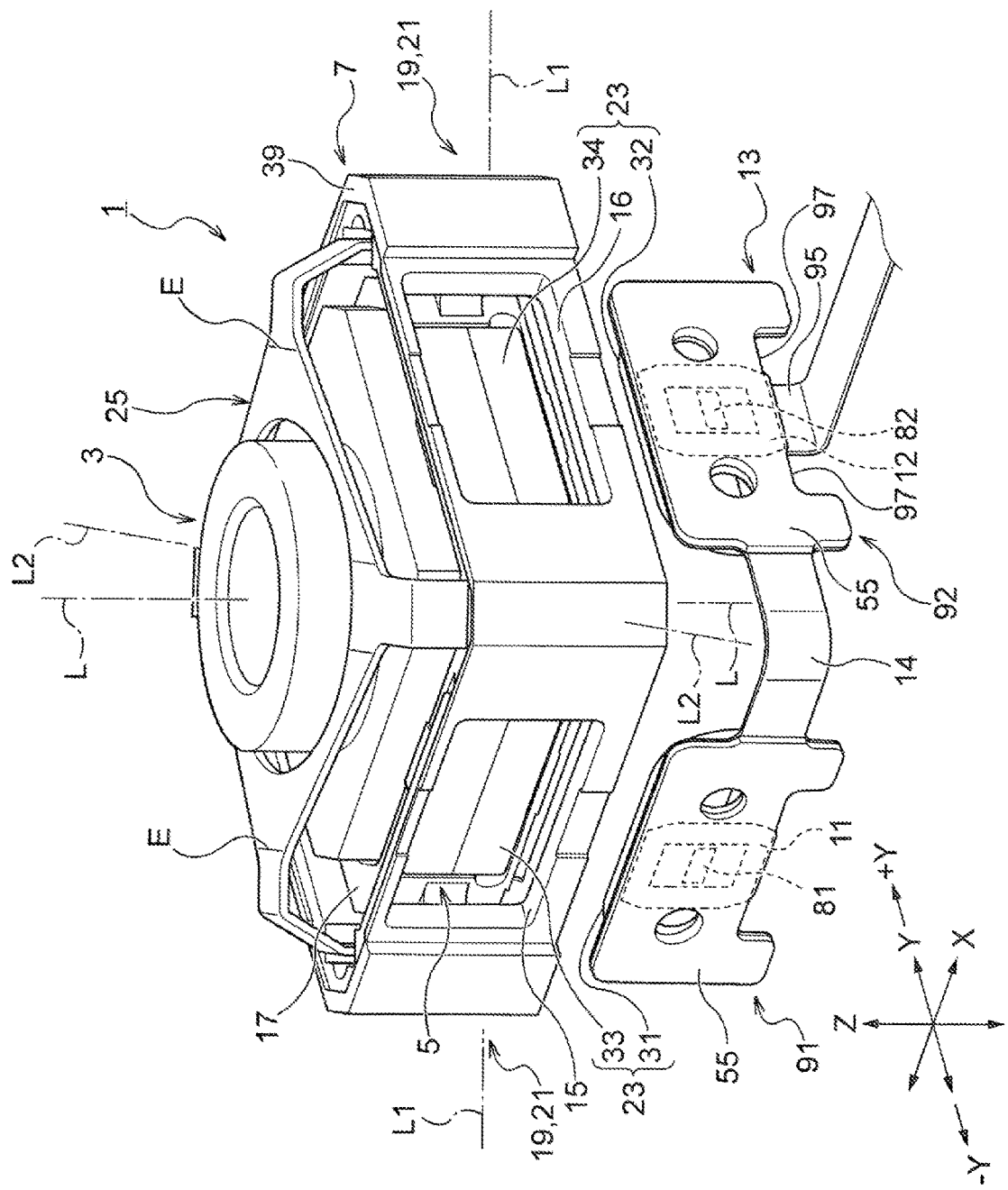
FIG. 2 is a perspective view of a state in which only a wiring member is separated from the optical unit illustrated in FIG. 1.

As illustrated in FIG. 2, the wiring member 13 has two mounting faces 91 and 92. The magnetic detection sensor 81, the magnetic member 11, and the coil 31 are fixed to the mounting face 91. The magnetic detection sensor 82, the magnetic member 12, and the coil 32 are fixed to the mounting face 92. The mounting faces 91 and 92 are reinforced with reinforcing plates 55. The wiring member 13 has a connecting portion 14 connecting the mounting faces 91 and 92. The line width of the connecting portion 14 is smaller than the width of the mounting faces 91 and 92 in the same direction as the line width. The mounting faces 91 and 92 in this description may not be a strictly flat face so long as the magnetic detection sensors 81 and 82, the magnetic members 11 and 12, and the coils 31 and 32 can be fixed thereto.

The mounting face 91 on which the magnetic detection sensor 81, the magnetic member 11, and the coil 31 are fixed is attached to an attachment site 15 of the fixed body 7. The mounting face 92 on which the magnetic detection sensor 82, the magnetic member 12, and the coil 32 are fixed is attached to an attachment side 16 of the fixed body 7. In this way, the relative positions of the components and the magnets 33 and 34 are determined.

Figure 4:
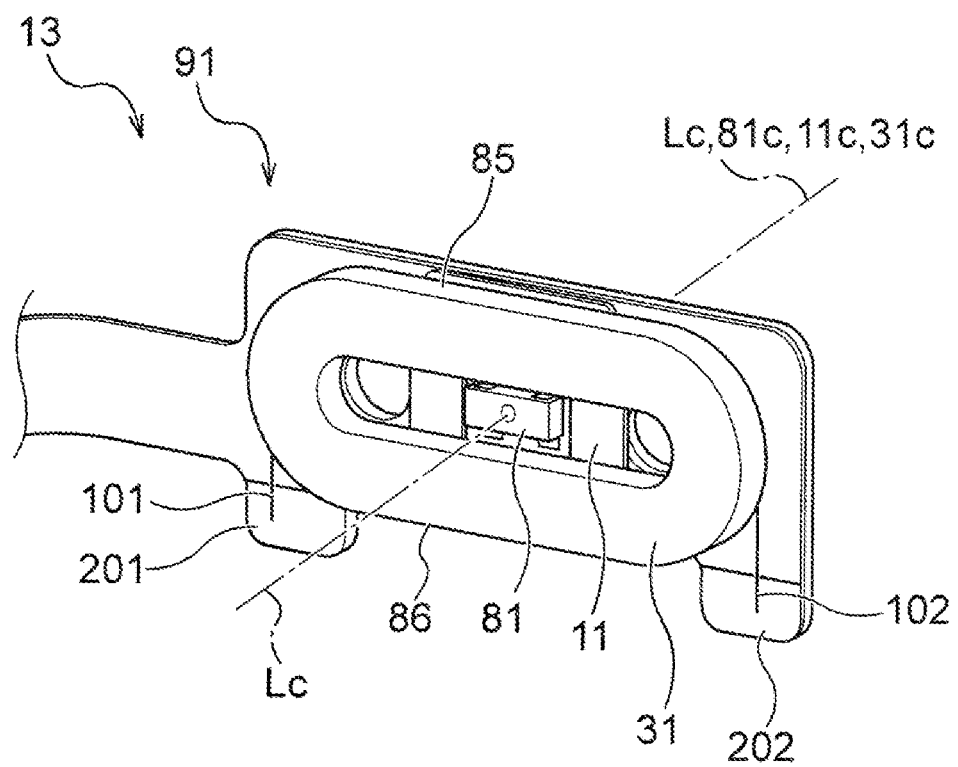
FIG. 4 is a perspective view of the main portion of the wiring member according to the first embodiment viewed from the coil side.

As illustrated in FIGS. 4 and 5, the magnetic detection sensor 81, the magnetic member 11, and the coil 31 are fixed to the mounting face 91 such that the center 81c of the magnetic detection sensor 81, the center 11c of the magnetic member 11, and the center 31c of the coil 31 are aligned along an axis Lc. Although not illustrated, similarly, the magnetic detection sensor 82, the magnetic member 12, and the coil 32 are fixed to the mounting face 92 such that the center 82c of the magnetic detection sensor 82, the center 12c of the magnetic member 12, and the center 32c of the coil 32 are aligned along an axis Lc.

Here, the center 81c of the magnetic detection sensor 81 refers not to the center of the external shape of the sensor body but refers to the functional center of the magnetic detection sensor 81.

The center 11c of the magnetic member 11 refers to a functional center of a magnetic member that uses a magnetic attraction force with the magnet 33 to return the movable body to the origin position. For example, in the case where the magnetic member is composed of two separate components, the center 11c of the magnetic member 11 refers to the functional center of the two components of the magnetic member.

The term "coil center" refers to the functional center of a coil that constitutes the swing drive mechanism that swings the movable body.

The specific configuration of the optical unit 1 having a shake correction function will now be described in detail.

The optical unit 1 having a shake correction function according to the first embodiment includes a fixed body 7 surrounds and supports a movable body 5 so as to be shiftable in the pitching (vertical shake) direction Y and the yawing (lateral shake) direction X, and a support mechanism 21 that includes a gimbal frame 25 that supports the movable body 5 so as to be rotatable relative to the fixed body 7 around a first axis L1 intersecting the direction of optical axis L of an optical module 3. The support mechanism 21 supports the movable body 5 via a first support 19 such that the movable body 5 is rotatable around the first axis L1 relative to the fixed body 7.

In the first embodiment, the support mechanism 21 also supports the movable body 5 on the gimbal frame 25 via a second support 20 such that movable body 5 is rotatable around a second axis L2 intersecting the direction of optical axis L and the direction of the first axis L1.

Figure 1:
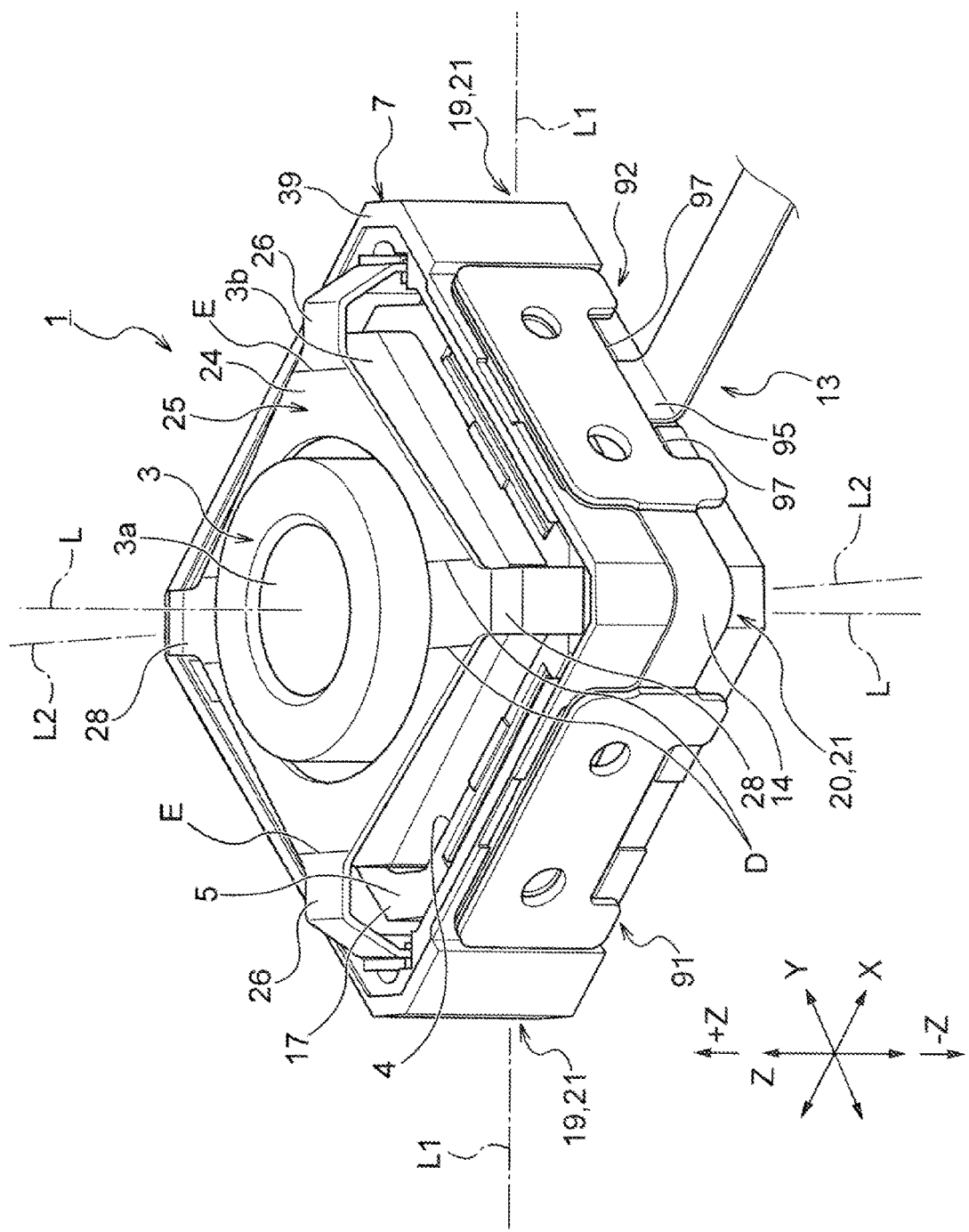
FIG. 1 is a perspective view of an optical unit having a shake correction function according to a first embodiment of the present disclosure.
Figure 3:
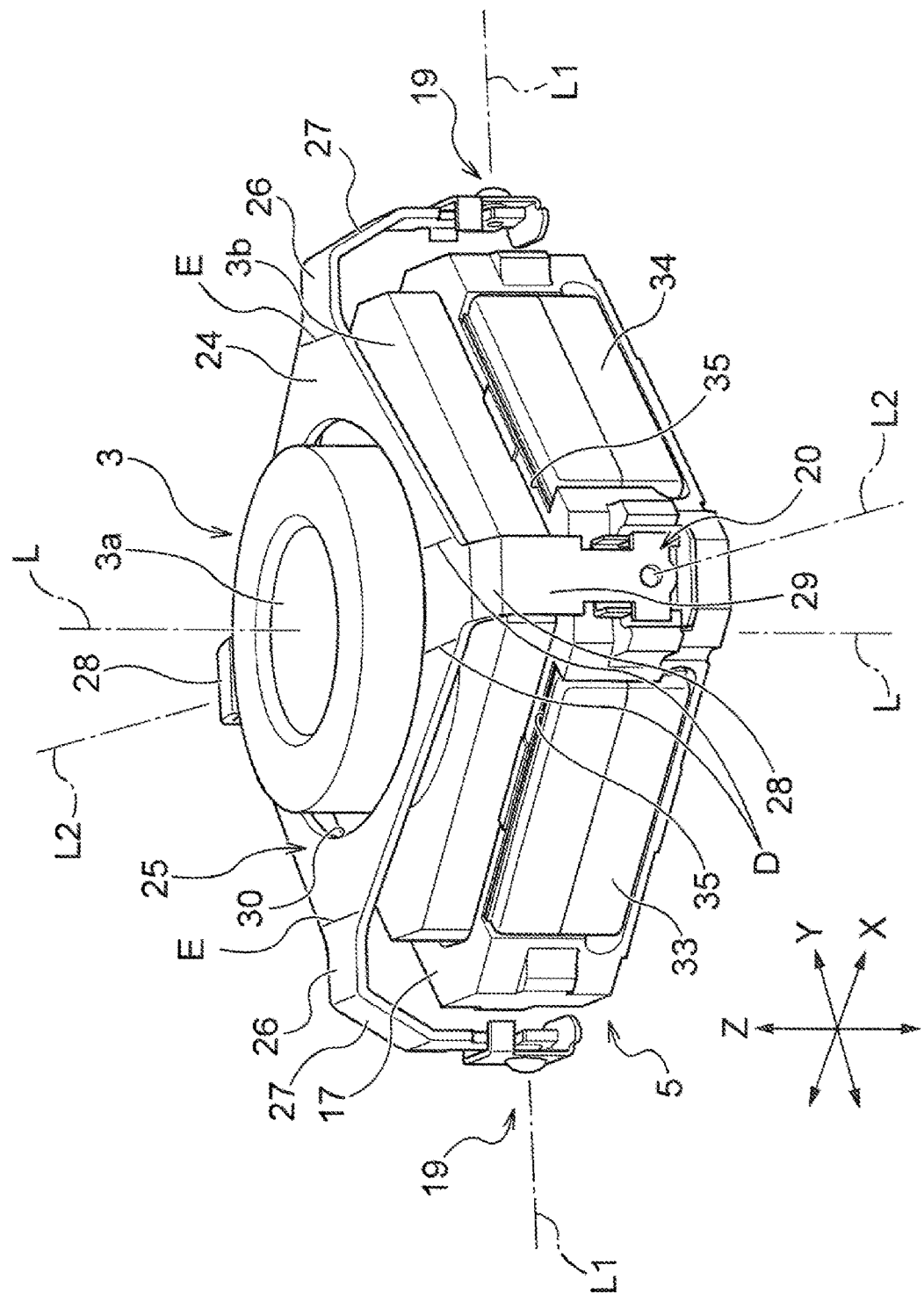
FIG. 3 is a perspective view of a movable body part from which the wiring members, a fixed body, and a gimbal frame are removed from the optical unit illustrated in FIG. 2.

The first embodiment includes a swing drive mechanism 23 that drives the movable body 5 around the first axis L1 and the second axis L2. The swing drive mechanism 23 corrects the attitude of the movable body 5, and includes correction coils 31 and 32 and magnets 33 and 34. The correction coils 31 and 32 are disposed on the side of the fixed body 7, as illustrated in FIGS. 1 and 2, and the magnets 33 and 34 are disposed on the side of the movable body 5, as illustrated in FIGS. 2 and 3. In FIG. 3, the reference numeral 35 denotes an adhesive agent.

The correction coils 31 and 32 and magnets 33 and 34 perform pitching and yawing correction of the movable body 5.

Movable Body

As illustrated in FIG. 3, the movable body 5 includes an optical module 3 and a frame 17 that holds the optical module 3 and attaches magnets 33 and 34 for detecting and correcting pitching and yawing.

The optical module 3 includes a lens 3a on the object side+Z. A rectangular housing 3b of the optical module 3 accommodates optical equipment for image capturing. The frame 17 is a rectangular frame-shaped member that surrounds four faces of the optical module 3 other than the front face on which the lens 3a of the optical module 3 is disposed and the rear face opposite to the front face. The magnets 33 and 34 for detecting pinching and yawing are fixed to two outer faces of the frame 17.

Fixed Body

As illustrated in FIGS. 1 and 2, the fixed body 7 includes an outer casing 39. The coils 31 and 32 for correcting the pitching and yawing and the wiring member 13 are disposed inside the outer casing 39. In the first embodiment, as illustrated in FIG. 2, the correction coils 31 and 32 are disposed on the back side of the wiring member 13 at positions corresponding to the magnets 33 and 34.

The outer casing 39 has a window 4 on the front face on the object side+Z and an opening on the rear face on the opposite side−Z. The outer casing 39 is a rectangular container slightly larger than the optical module 3.

Supporting Mechanism Including Gimbal Frame

As illustrated in FIGS. 1 and 3, the support mechanism 21 includes a gimbal frame 25 having resilience generated by bending a flat metal plate. In the first embodiment, the gimbal frame 25 is disposed on the object side+Z of the optical module 3. A circular opening 30 is formed in the central region of a base frame 24 on the light incident side of the optical module 3. The gimbal frame 25, which has an overall X-shape, includes a rectangular frame-shaped base frame 24 having an opening 30 in the center, first extensions 26 that extend along the direction of the first axis L1 about the optical axis L, and second extensions 28 that extend from the corners of the base frame 24 along the direction of the second axis L2, the first extensions 26 and the second extensions 2 extending about the optical axis L from the four corners of the base frame 24.

In the first embodiment, the gimbal frame 25 includes first support extensions 27 and second support extensions 29 that are disposed in an X shape and elongated along the extension directions. The distal portions of the first extensions 26 and the second extensions 28 are bent along the direction of optical axis L to respectively form first support extensions 27 and second support extensions 29. The first supports 19 are disposed on the first support extensions 27, and the second supports 20 are disposed on the second support extensions 29.

As illustrated in FIGS. 1 to 3, in the gimbal frame 25, the gaps in the direction of optical axis L between the first extensions 26 and the movable body 5 are larger than the gaps in the direction of optical axis L between the second extensions 28 and the movable body 5. In other words, the gimbal frame 25 is bent along the bending lines D and E so that the height of the distal ends of the first extensions 26 in the optical axis direction+Z is higher than the height of the distal ends of the second extensions 28 in the optical axis direction+Z or higher relative to the movable body 5.

All of the first support extensions 27 and the second support extensions 29 may not have plate shapes. Alternatively, some of the first support extensions 27 and the second support extensions 29 may have plate shapes to generate resilience. One of the first support extensions 27 and the second support extensions 29 may be any shape besides a plate shape (for example, a rod shape).

As illustrated in FIG. 5, in the first embodiment, the mounting face 91 of the wiring member 13 further includes a sensor fixing region 56 to which the magnetic detection sensor 81 is fixed, and alignment holes 57 and 58 for aligning the center 81c of the magnetic detection sensor 81, the center 11c of the magnetic member 11, and the center 31c of the coil 31 on the axis Lc.

A method of fixing the magnetic detection sensor 81, the magnetic member 11, and the coil 31 to the mounting face 91 will now be described.

1. The magnetic detection sensor 81 is aligned with the sensor fixing region 56 of the wiring member 13 and fixed using an alignment jig, or the like, to position the center 81c of the magnetic detection sensor 81. In FIG. 5, reference numerals 59 are lands for electrical connection disposed on the wiring member 13. The lands are disposed at provided at four positions.

As illustrated in FIG. 6, four terminals 69 of the magnetic detection sensor 81 are aligned and soldered with the lands 59, to position and fix the mounting face 91 on the mounting face 91.

The mounting face 92 is also provided with a sensor fixing region and alignment holes that have the same structures as those of the mounting face 91. Thus, descriptions thereof are omitted.

2. The magnetic member 11 is aligned and fixed with reference to the center 81c of the magnetic detection sensor 81 using an alignment jig so as to fix the magnetic member 11 to the mounting face 91 in an aligned state. The magnetic member 11 is fixed to the mounting face 91 using plating and soldering. Alternatively, the magnetic member 11 may be fixed using an adhesive agent.

3. Alignment jigs or alignment pins 75 and 77 are respectively inserted into the alignment holes 57 and 58 in the mounting face 91 in the state illustrated in FIG. 6. Here, the alignment hole 57 is a reference hole having a shape matching that of the alignment pin 75. The alignment hole 58 is a long hole extending in the X direction. By making one of the holes long, the two alignment pins can be readily inserted into two alignment holes.

Subsequently, the coil 31 is fit over the alignment pins 75 and 77 while the alignment pins 75 and 77 are passed through the alignment holes 57 and 58. This results in the state illustrated in FIG. 5. The alignment holes 57 and 58 are provided for alignment of the center 81c of the magnetic detection sensor 81, the center 11c of the magnetic member 11, and the center 31c of the coil 31 with the axis Lc. In this way, the coil 31 is also positioned and fixed. The coil 31 is fixed to the mounting face 91 of the magnetic member 11 using an adhesive agent.

As illustrated in FIGS. 4 and 5, in the first embodiment, the two end portions of the magnetic member 11 in the Z direction are fixed to the effective sides 85 and 86 of the coil 31 corresponding to the magnet 33. Here, the term "effective side" refers to the side necessary for generating an electromagnetic force by action between the magnet 33 and the coil 31.

As a result, when the coil 31 is not energized, the magnetic member 11 generates a magnetic force between the magnetic member 11 and the magnet 33. When the coil 31 is energized, the magnetic member 11 serves as a back yoke that intensifies the magnetic force between the magnet 33 and the coil 31.

As illustrated in FIGS. 1 and 2, in the first embodiment, the wiring member 13 has an extending portion 95 that extends from the mounting face 91 in the direction along the surface, and a recess 97 formed in the area where the mounting face 91 is connected with the extending portion 95.

As a result, the recess 97 can reduce the stress generated on the mounting face 91 when the extending portion 95 is bent and routed.

As illustrated in FIGS. 4 and 5, in the first embodiment, the wiring member 13 includes lands 201 and 202 that are electrically connected with a first end 101 and a second end 102, respectively, of the coil 31. The winding start position 105 and the winding end position 106 of the coil 31 are disposed at positions corresponding to the lands 201 and 202, respectively.

Here, for the positions 105 and 106 of the coil 31 to be disposed at positions corresponding to the lands 201 and 202, respectively, the positions 105 and 106 of the coil 31 do not have to be in exact alignment with the lands 201 and 202, respectively, in the Z direction. For the winding start position 105 and the winding end position 106 of the coil 31 to correspond to the lands 201 and 202, respectively, the positions 105 and 106 of the coil 31 should be disposed in a relative arrangement in which the positions 105 and 106 are disposed close to the lands 201 and 202, respectively. In other words, the winding start position 105 and the winding end position 106 of the coil 31 and the regions in which the lands 201 and 202 reside in the X direction should be disposed in a relative overlapping arrangement. In the relative overlapping arrangement, the positions 105 and 106 and the lands 201 and 202 do not have to exactly align and may be slightly displaced. For example, the winding start position 105 of the coil 31 may be set such that the first end 101 extends from an inner circumferential position (in contact with the alignment hole 57) of the coil 31 to the region in which the land 201 resides by the shortest distance, beside routing the coil 31 so as to extend the first end 101 to the substantial center of the land 201 in the width direction, as illustrated in FIG. 7.

In this way, the first end 101 of the lead of the coil 31 in the winding start position 105 and the second end 102 of the lead of the coil 31 in the winding end position 106 can be directly connected with the lands 201 and 202, respectively, and readily connected by soldering, or the like.

Advantageous Effects of First Embodiment

The wiring member 13 includes the magnetic detection sensors 81 and 82, the magnetic members 11 and 12, and the mounting faces 91 and 92 on which the coils 31 and 32 are fixed. The magnetic detection sensors 81 and 82, the magnetic members 11 and 12, and the coils 31 and 32 are fixed to the mounting faces 91 and 92 such that the centers 81*c* and 82*c*, the centers 11*c* and 12*c*, and the centers 31*c* and 32*c* are aligned along the axis Lc. That is, the magnetic detection sensors 81 and 82, the magnetic members 11 and 12, and the coils 31 and 32 are fixed to the mounting faces 91 and 92 of the wiring member 13.

As a result, it is possible to fix the magnetic detection sensors 81 and 82, the magnetic members 11 and 12, and the coils 31 and 32 to the wiring member 13 before being assembled into the finished product. Thus, the functional centers of the components can be more readily aligned before assembly in comparison with that of a conventional structure.

The wiring member 13 in which the magnetic detection sensors 81 and 82, the magnetic members 11 and 12, and the coils 31 and 32 are aligned and fixed to the mounting faces 91 and 92 can be attached to the fixed body 7 or the movable body 5, to achieve ready alignment with the magnets 33 and 34.

Thus, a decrease in the drive torque and a decrease in the position detection precision can be suppressed in the optical unit 1 having a shake correction function, and the shake correction function can be provided in a stable state.

In the first embodiment, the wiring member 13 in which the magnetic detection sensors 81 and 82, the magnetic members 11 and 12, and the coils 31 and 32 are aligned and fixed to the mounting faces 91 and 92 can be attached to the attachment sites 15 and 16 of the fixed body 7, to complete the assembly. Thus, assembly is easy. The wiring member 13 can also be readily aligned with the magnets 33 and 34 on the movable body 5.

In the first embodiment, the wiring member 13 includes multiple mounting faces 91 and 92. Thus, it readily supports a shake correction structure for correcting shake around two or more axes.

The connecting portion 14 that connects the mounting faces 91 and 92 has a width smaller than that of the mounting faces 91 and 92 in the same direction. Thus, the wiring member 13 can be readily routed by bending, and the relative positions of adjacent mounting faces 91 and 92 can be finely and readily adjusted. The stress generated in the wiring member 13 when bent can be reduced.

Second Embodiment

An optical unit 1 having a shake correction function according to a second embodiment will now be described in with reference to FIG. 7. FIG. 7 is a diagram corresponding to FIG. 5 of the first embodiment. Configurations that differ from those of the first embodiment will be described. Common elements will be denoted by the same reference numerals, and descriptions thereof will be omitted.

The second embodiment includes paired magnetic members 11*a* and 11*b*, as illustrated in FIG. 7. In other words, two magnetic members are provided, unlike the single magnetic member having a square fame shape according to the first embodiment. The magnetic members 11*a* and 11*b* have the same magnetic characteristics.

The second embodiment achieves the same advantageous effects as those of the first embodiment.

Other Embodiments

The optical unit 1 having a shake correction function according to at least an embodiment of the present disclosure basically has the above-described configuration. However, it is also possible to make changes and omissions in parts of the configuration without departing from the scope of the disclosure.

In the first and second embodiments, the magnets 33 and 34 of the swing drive mechanism 23 are fixed to the movable body 5, and the coils 31 and 32 are fixed to the fixed body 7. Alternatively, the magnets 33 and 34 of the swing drive mechanism 23 may be fixed to the fixed body 7, and the coils 31 and 32 may be fixed to the movable body 5.

The wiring member 13 is not limited to a flexible wiring board and may be any other type of wiring member. However, it is desirable that the wiring member has the same characteristics as a flexible wiring board.

The optical module 3 is not limited to the camera module described in the embodiments, and alternatively may be any other module, such as a laser irradiation module or an optical sensor module. In the case where the optical module 3 has any other shape, such as a cylindrical shape, the shapes of the holder frame 17 and the coil attachment frame 35 can match the shape of the optical module 3.

An optical unit having a shake correction function that solves the above-described issues includes a movable body including an optical module, a fixed body that supports the movable body in a swingable manner, a swing drive mechanism in which one of a magnet and a coil is fixed to the movable body and the other of the magnet and the coil is fixed to the fixed body to swing the movable body relative to the fixed body, a magnetic member that returns the movable body to an original position, a magnetic detection sensor that detects a magnetic field of the magnet, and a wiring member connected with the coil, the wiring member including a mounting face on which the magnetic detection sensor, the magnetic member, and the coil are fixed, the center of the magnetic detection sensor, the center of the magnetic member, and the center of the coil being coaxially aligned and fixed to the mounting face.

Here, the term "the center of the magnetic detection sensor" refers not to the center of the external shape of the sensor body but refers to the functional center of the magnetic detection sensor.

The term "the center of the magnetic member" refers to a functional center of a magnetic member that uses a magnetic attraction force with the magnet to return the movable body to the origin position. For example, in the case where the magnetic member is composed of two separate components, the center of the magnetic member refers to the functional center of the two components of the magnetic member.

The term "the center of the coil" refers to the functional center of a coil that constitutes the swing drive mechanism that swings the movable body.

The term "mounting face" in this description may not be a strictly flat face so long as the magnetic detection sensor, the magnetic member, and the coil can be fixed thereto.

According to an embodiment, the wiring member includes a mounting face on which the magnetic detection sensor, the magnetic member, and the coil are fixed, and the magnetic detection sensor, the magnetic member, and the coil are fixed to the mounting face while the center of the magnetic detection sensor, the center of the magnetic member, and the center of the coil are coaxially aligned. That is, the magnetic detection sensor, the magnetic member, and the coil are fixed to the mounting face of the wiring member.

As a result, it is possible to fix the magnetic detection sensor, the magnetic member, and the coils to the wiring member before being assembled into the finished product. Thus, the functional centers of the components can be aligned before assembly more readily than the conventional structure.

The wiring member in which the magnetic detection sensor, the magnetic member, and the coil are aligned and fixed to the mounting face can be attached to the fixed body or the movable body, to achieve ready alignment with the magnet.

Thus, a decrease in the drive torque and a decrease in the position detection precision can be suppressed in the optical unit having a shake correction function, and the shake correction function can be provided in a stable state.

In the optical unit having a shake correction function according to at least an embodiment of the present disclosure, the magnet of the swing drive mechanism may be fixed to the movable body, and the coil of the swing drive mechanism may be fixed to the fixed body.

According to an embodiment, the wiring member in which the magnetic detection sensor, the magnetic member, and the coil are aligned and fixed to the mounting face may be fixed to the fixed body. In this way, assembly can be completed. Thus, assembly is easy. The wiring member can also be readily aligned with the magnet on the movable body.

According to at least an embodiment of the present disclosure, in an optical unit having a shake correction function, a portion of the magnetic member may be fixed to an effective side of the coil corresponding to the magnet.

According to an embodiment, a portion of the magnetic member may be fixed to an effective side of the coil corresponding to the magnet. As a result, when the coil is not energized, the magnetic member generates a magnetic force between the magnetic member and the magnet. When the coil is energized, the magnetic member serves as a back yoke that intensifies the magnetic force between the magnet and the coil.

In the optical unit having a shake correction function according to at least an embodiment of the present disclosure, the wiring member may include a sensor fixing region to which the magnetic detection sensor is fixed, and an alignment hole that coaxially aligns the center of the magnetic detection sensor, the center of the magnetic member, and center of the coil.

According to an embodiment, the magnetic detection sensor is fixed to the sensor fixing region of the wiring member, and thereby the center position of the magnetic detection sensor is determined.

The wiring member has an alignment hole for coaxially aligning the center of the magnetic detection sensor, the center of the magnetic member, and the center of the coil. In this way, when the coil and the magnetic member are assembled with the mounting face and fixed, for example, an alignment jig may be used with reference to the alignment hole, to position the magnetic member and the coil on the mounting face with high accuracy.

In the optical unit having a shake correction function according to at least an embodiment of the present disclosure, the wiring member may include a plurality of mounting faces, and a section of the wiring member where the mounting faces are connected with each other have a line width smaller than a width of the mounting faces in the direction of the line width.

According to an embodiment, the wiring member includes multiple mounting faces, and thus, it is able to support a shake correction structure for correcting shake around two or more axes.

The connecting portion that connects the mounting faces has a line width smaller than that of the mounting faces in the direction of the line width. Thus, the wiring member can be readily routed by bending, and the relative positions of adjacent mounting faces can be finely and readily adjusted. The stress generated in the wiring member when bent can be reduced.

In the optical unit having a shake correction function according to at least an embodiment of the present disclosure, the wiring member may include an extending portion that extends from the mounting face in a direction along the mounting face, and a recess disposed in a section where the mounting face is connected with the extending portion.

According to an embodiment, a recess is disposed in a section where the mounting face is connected with the extending portion. Thus, the recess can reduce the stress generated at the mounting face when the extending portion is bent and routed.

In the optical unit having a shake correction function according to at least an embodiment of the present disclosure, the wiring member may include lands for electrical connection respectively with one end and the other end of the coil, and a winding start position and a winding end position of the coil be disposed at positions corresponding to each of the lands.

According to an embodiment, the leads of the coil at the winding start position and the winding end position can be directly connected with the lands, and readily connected by soldering, or the like.

At least an embodiment of the present disclosure relates to a wiring member. The wiring member includes at least two mounting faces on each of which a magnetic detection sensor, a magnetic member, and a coil are fixed. The center of the magnetic detection sensor, the center of the magnetic member, and the center of the coil are coaxially aligned and fixed to each of the mounting faces.

According to an embodiment, the wiring member includes a mounting face on which the magnetic detection sensor, the magnetic member, and the coil are fixed, and the magnetic detection sensor, the magnetic member, and the coil are fixed to the mounting face while the center of the magnetic detection sensor, the center of the magnetic member, and the center of the coil are coaxially aligned. That is, the magnetic detection sensor, the magnetic member, and the coil are fixed to the mounting face of the wiring member.

As a result, it is possible to fix the magnetic detection sensor, the magnetic member, and the coils to the wiring member before being assembled into the finished product. Thus, the functional centers of the components can be aligned before assembly more readily than the conventional structure.

The wiring member in which the magnetic detection sensor, the magnetic member, and the coil are aligned and fixed to the mounting face may be fixed to an assembly position of the optical unit having a shake correction function. In this way, assembly thereof can be facilitated.

A method of producing a wiring member having at least two mounting faces on each of which a magnetic detection sensor, a magnetic member, and a coils are fixed, the method includes fixing the magnetic detection sensor to a sensor fixing region of each of the mounting faces, and positioning and fixing the magnetic member and the coil on each of the mounting faces such that the center of the magnetic detection sensor, the center of the magnetic member, and the center of the coil are coaxially aligned.

According to an embodiment, a wiring member having at least two mounting faces on each of which a magnetic detection sensor, a magnetic member, and a coil are fixed can be readily produced.

What is claimed is:

1. An optical unit having a shake correction function, comprising:
    a movable body including an optical module;
    a fixed body that supports the movable body in a swingable manner;
    a swing drive mechanism in which one of a magnet and a coil is fixed to the movable body and the other of the magnet and the coil is fixed to the fixed body to swing the movable body relative to the fixed body;
    a magnetic member that returns the movable body to an original position;
    a magnetic detection sensor that detects a magnetic field of the magnet; and
    a wiring member connected with the coil, wherein
    the wiring member includes a mounting face on which the magnetic detection sensor, the magnetic member, and the coil are fixed, a center of the magnetic detection sensor, a center of the magnetic member, and a center of the coil being coaxially aligned and fixed to the mounting face.

2. The optical unit having a shake correction function according to claim 1, wherein,
    the magnet of the swing drive mechanism is fixed to the movable body, and
    the coil of the swing drive mechanism is fixed to the fixed body.

3. The optical unit having a shake correction function according to claim 1, wherein a portion of the magnetic member is fixed to an effective side of the coil corresponding to the magnet.

4. The optical unit having a shake correction function according to claim 1, wherein,
    the wiring member includes:
        a sensor fixing region to which the magnetic detection sensor is fixed; and
        an alignment hole that coaxially aligns the center of the magnetic detection sensor, the center of the magnetic member, and the center of the coil.

5. The optical unit having a shake correction function according to claim 1, wherein,
    the wiring member includes a plurality of the mounting faces, a section of the wiring member where the mounting faces are connected with each other having a line width smaller than a width of the mounting faces in a direction of the line width.

6. The optical unit having a shake correction function according to claim 1, wherein,
    the wiring member includes:
        an extending portion that extends from the mounting face in a direction along the mounting face, and
        a recess disposed in a section where the mounting face is connected with the extending portion.

7. The optical unit having a shake correction function according to claim 6, wherein,
    the wiring member includes lands for electrical connection respectively with one end and the other end of the coil, and
    a winding start position and a winding end position of the coil are disposed at positions corresponding to each of the lands.

* * * * *